US007106066B2

(12) United States Patent
Ivanciw et al.

(10) Patent No.: US 7,106,066 B2
(45) Date of Patent: Sep. 12, 2006

(54) MICRO-ELECTROMECHANICAL SWITCH PERFORMANCE ENHANCEMENT

(75) Inventors: Dan A. Ivanciw, Woburn, MA (US); Claude Hilbert, Austin, TX (US)

(73) Assignee: Teravicta Technologies, Inc., Austin, TX (US)

( * ) Notice: Subject to any disclaimer, the term of this patent is extended or adjusted under 35 U.S.C. 154(b) by 49 days.

(21) Appl. No.: 10/229,586

(22) Filed: Aug. 28, 2002

(65) Prior Publication Data

US 2004/0040828 A1 Mar. 4, 2004

(51) Int. Cl.
*G01R 31/02* (2006.01)

(52) U.S. Cl. ........................................ 324/415; 307/137

(58) Field of Classification Search ................. 324/415; 363/33; 307/137
See application file for complete search history.

(56) References Cited

U.S. PATENT DOCUMENTS

| | | | | | |
|---|---|---|---|---|---|
| 4,356,730 | A | | 11/1982 | Cade | 363/33 |
| 5,523,633 | A | | 6/1996 | Imaizumi et al. | 307/137 |
| 6,020,564 | A | * | 2/2000 | Wang et al. | 200/181 |
| 6,058,027 | A | | 5/2000 | Vargha et al. | 363/33 |
| 6,160,230 | A | * | 12/2000 | McMillan et al. | 200/181 |
| 6,231,227 | B1 | * | 5/2001 | Andersen | 374/4 |
| 6,232,790 | B1 | * | 5/2001 | Bryan et al. | 324/754 |
| 6,307,169 | B1 | * | 10/2001 | Sun et al. | 200/181 |
| 6,583,374 | B1 | * | 6/2003 | Knieser et al. | 200/181 |
| 6,642,067 | B1 | * | 11/2003 | Dwyer | 438/17 |
| 6,720,851 | B1 | * | 4/2004 | Hallbjorner et al. | 335/78 |

FOREIGN PATENT DOCUMENTS

| | | |
|---|---|---|
| DE | 40 42 184 | 7/1992 |
| EP | 1 146 532 | 10/2001 |
| EP | 1 156 504 | 11/2001 |
| WO | 95/01624 | 1/1995 |
| WO | 01/67476 | 9/2001 |
| WO | 02/23207 | 3/2002 |

OTHER PUBLICATIONS

Patent Abstracts of Japan, publication No. 02297818, published Dec. 10, 1990.
Patent Abstracts of Japan, publication No. 04058429, published Feb. 25, 1992.
IBM Technical Disclosure Bulletin, "Nonvolatile Micromechanical Memory Cell," vol. 36, No. 7, Jul. 1993, pp. 45–46.
Goldsmith et al., "Lifetime Characterization of Capacitive RF MEMS Switches," 2001 IEEE MTT–S Digest, pp. 227–230.
IBM Technical Disclosure Bulletin, "Three–Terminal Latching Micromechanical Switch," vol. 30, No. 6, Nov. 1987, pp. 393–394.
International Search Report, application No. PCT/US03/26696, mailed Apr. 15, 2004.
Schimkat, "Contact Materials for Microrelays," 11th Annual Workshop on Micro Electrical Mechanical Systems, Heidelberg, Germany, Jan. 1998, pp. 190–194.

* cited by examiner

*Primary Examiner*—Vincent Q. Nguyen
(74) *Attorney, Agent, or Firm*—Kevin L. Daffer; Mollie E. Lettang; Daffer McDaniel, LLP

(57) ABSTRACT

In methods and circuits for using associated circuitry to enhance performance of a micro-electromechanical switch, one of the method embodiments is a contact conditioning process including applying a time-varying voltage to the control element of a closed switch. In another embodiment, a voltage profile applied to the control element of the switch can be tailored to improve the actuation speed or reliability of the switch. In another method embodiment, the performance of a switch may be evaluated by measuring a performance parameter, and corrective action initiated if the switch performance is determined to need improvement. An embodiment of a circuit for maintaining performance of a micro-electromechanical switch includes first and second signal line nodes, sensing circuitry coupled to the signal line nodes and adapted to sense a performance parameter value of the switch, and control circuitry operably coupled to at least one terminal of the switch.

20 Claims, 6 Drawing Sheets

MICRO-ELECTROMECHANICAL SWITCH PERFORMANCE ENHANCEMENT

BACKGROUND OF THE INVENTION

1. Field of the Invention

This invention pertains to microelectromechanical switches, and more particularly to the use of control circuitry to enhance performance and reliability of a switch.

2. Description of the Related Art

The following descriptions and examples are not admitted to be prior art by virtue of their inclusion within this section.

Micro-electromechanical switches, or switches made using micro-electro-mechanical systems (MEMS) technology, are of interest in part because of their potential for allowing integration of high-quality switches with circuits formed using integrated circuit (IC) technology. As compared to transistor switches formed with conventional IC technology, for example, MEMS contact switches may exhibit lower losses and a higher ratio of off-impedance to on-impedance. ("MEMS switch" and "micro-electromechanical switch" are used interchangeably herein, although the acronym does not correspond exactly.) The mechanical nature of a MEMS switch can create some performance problems, however. For example, the resistance of the switch when closed can be increased by aging or degradation of the switch contact surfaces, which can be caused by exposure to humidity and other contaminants. Such contamination can also lead to sticking of the switch and difficulty in opening it. Furthermore, the switching speed of a MEMS switch is generally lower than that of a transistor switch.

Addressing the above problems can be made difficult by tradeoffs inherent to MEMS switch operation. Modifications which improve closing performance of a switch, for example, may degrade its opening performance. In the case of a cantilever switch, for example, approaches to reducing the closing time of the switch include reducing the stiffness of the cantilever beam and reducing the gap between the contact element on the beam and the underlying contact pad. Unfortunately, these design changes typically have the effect of making opening of the switch more difficult. MEMS cantilever switch designs generally use an applied voltage to close the switch, and often rely on the spring force in the beam to open the switch when the applied voltage is removed. In opening the switch, the spring force, or restoring force, of the beam must typically counteract what is often called "stiction." Stiction refers to various forces tending to make two surfaces stick together, such as van der Waals forces, surface tension caused by moisture between the surfaces, and/or bonding between the surfaces. In general, design modifications to a switch which act to reduce its closing time also tend to make the switch harder to open, such that the opening time may be increased, or the switch may not open reliably. It would therefore be desirable to develop ways to improve switch performance and reliability independent of the mechanical design of the switch itself.

SUMMARY OF THE INVENTION

The problems outlined above may be in part addressed by using associated circuitry to enhance MEMS switch performance. One of the method embodiments described herein is a contact conditioning process in which applying a time-varying voltage to the control element of a closed switch causes a scrubbing action of the contacting end of the beam of the switch against its corresponding contact pad. As defined herein, the conditioning process encompasses several different meanings depending on the condition of the contact area (i.e., the region of contact between the beam and the contact pad). If the contact previously has not been exercised, then conditioning includes actually forming the contact by virtue of the scrubbing action. If the contact area isn't significantly deteriorated, conditioning merely involves cleaning of the contact area of any performance-lessening material there from. However, if the contact area is more deteriorated, then conditioning may include reforming or replenishing the contact area back to its original performance level. The scrubbing action also conjures different meanings, each of which may be involved in conditioning the contact area. For example, scrubbing involves a back-and-forth (lateral) movement of the beam along a plane parallel to and in contact with the contact pad. Scrubbing can also involve up-and-down movement of at least a portion of the beam perpendicular to the contact pad, including motion such that the beam actually "taps" against the contact pad. The time-varying voltage can increase not only the lateral displacement (or movement) but also the amount of the beam that contacts the contact pad. A greater voltage will increase the lateral movement and the degree by which the beam contacts with, and thereby scrubs against, the contact pad. The stimuli used to effectuate the scrubbing action is also not limited to electrical (or electrostatic). For example, a time-varying magnetic field or time-varying thermal energy applied to the switch can also cause the desired conditioning process.

In another embodiment the electrostatic, magnetic or thermal stimuli can be tailored to improve the actuation speed of the switch, or to change the force with which the switch makes contact, improving its reliability. For example, if the stimuli comprises voltage, then the voltage profile may be tailored to overcome stiction in the case of an active-opening switch such as a "teeter-totter" switch.

In another method embodiment, the performance of a switch may be evaluated by measuring some performance parameter, such as the resistance of the switch when closed. If the switch performance is determined to need improvement, corrective action could be undertaken. The contact conditioning process or tailored stimuli profile described above are examples of such corrective action. Using the approach described herein may allow switch performance to be enhanced using associated circuitry, rather than by modifications to the physical structure of the switch that may degrade some aspects of performance while enhancing others.

A method for conditioning a contact surface of a micro-electromechanical switch may include applying a time-varying voltage profile to a control element of the switch after the switch has been closed, where the voltage profile is adapted to induce movement of a first switch contact surface against a second switch contact surface. In an embodiment, the switch remains closed for the entire time the voltage profile is applied. The voltage profile may in an embodiment include a periodic profile, such as one having a sinusoidal, sawtooth, or square-wave shape. This conditioning may be repeated at intervals during the operational lifetime of the switch. Such intervals could include, for example, a predetermined amount of time or a predetermined number of open/close to cycles of the switch.

A method for actuating a microelectromechanical switch may include applying a voltage profile including at least two nonzero voltage levels to a control element of the switch. In embodiments of the method, one or both of the nonzero voltage levels may include a gradual voltage ramp, and a transition to one or more of the voltages levels may include a voltage ramp. In an embodiment for closing the switch, the voltage profile includes a nonzero, pre-bias initial level and a subsequently-applied operating level having a voltage greater than the actuation voltage of the switch. In an alternative embodiment, the initial level may have a voltage at or slightly above the actuation voltage of the switch, while the operating level has a voltage greater than that of the initial level. In another embodiment the initial level may include a high-voltage pulse, and the operating level may have a voltage less than that of the initial level. In such an embodiment, the duration of the high-voltage pulse may be shorter than the time needed for the switch to become physically closed (make contact) in response to the pulse.

A method described herein for maintaining performance of a micro-electromechanical switch includes measuring a performance parameter of the switch, and, upon detecting switch performance below a predetermined level, initiating corrective action. The performance parameter may include, for example, a resistance of the switch when closed, a capacitance of the switch when open, a control voltage needed to close the switch, a time needed for opening or closing of the switch, or a number of open/close cycles performed by the switch. The corrective action may include, for example, initiating a contact conditioning procedure, applying a modified control voltage profile for opening or closing the switch, or discontinuing use of the switch and beginning use of an alternate switch.

Circuits for implementing methods such as those described above are also described herein. A circuit for maintaining performance of a micro-electromechanical switch includes first and second signal line nodes operably coupled to first and second signal lines, respectively, where the first and second signal lines are coupled together when the switch is closed. The circuit further includes sensing circuitry coupled to the signal line nodes and adapted to sense a performance parameter value of the switch, and control circuitry operably coupled to at least one terminal of the switch. The control circuitry is adapted to evaluate the sensed performance parameter value and initiate corrective action upon detecting switch performance below a predetermined level. The performance parameter may include, for example, a resistance or capacitance between the first and second signal line nodes. In an embodiment, the circuit may further include a control node operably coupled to a control element of the switch. In such an embodiment, the sensing circuitry may be coupled to the control node, and the performance parameter may include a control element voltage required to close the switch, or a time required to open or close the switch. The control circuitry may in an embodiment be adapted to compare the sensed performance parameter value with a stored threshold parameter value. In an embodiment, the control circuitry is operably coupled to a control element of the switch. In such an embodiment, the corrective action may include, for example, applying a varying control voltage to the control element to achieve a scrubbing action or applying a modified control voltage sequence to the control element. The control circuitry may in an embodiment be further coupled to a control element of an alternate switch. In such an embodiment, the corrective action may include deactivating the switch and activating the alternated switch. The circuit may in some embodiments include voltage translation circuitry operably coupled between the control circuitry and a control element of the switch, where the voltage translation circuitry is adapted to convert voltages output by the control circuitry to relatively higher voltages needed to activate the switch. The circuit may also in some embodiments include electrostatic discharge protection circuitry coupled between a control element of the switch and an externally-accessible terminal of the switch. In an embodiment, the circuit forms at least a portion of an integrated circuit.

A circuit for conditioning a contact surface of a micro-electromechanical switch includes a control node operably coupled to a control element of the switch, signal generation circuitry adapted to apply a time-varying voltage to the control node at a time when the switch has been closed, and control circuitry operably coupled to the signal generation circuitry and adapted to initiate the conditioning. In an embodiment, the signal generation circuitry is adapted to generate a periodic voltage signal. The circuit may in an embodiment further include sensing circuitry coupled between the signal generation circuitry and the control node, where the sensing circuitry is adapted to determine an actuation voltage of the switch. The circuit may further include voltage translation circuitry and/or electrostatic discharge protection circuitry in some embodiments, similar to that described above.

A circuit for actuating a micro-electromechanical switch includes a control node operably coupled to a control element of the switch, signal generation circuitry adapted for application of a voltage profile including at least two nonzero voltage levels to the control node, and control circuitry operably coupled to the signal generation circuitry, where the control circuitry is adapted to initiate the application of a voltage profile in order to actuate the switch. In an embodiment for closing the switch, the voltage profile includes a nonzero initial level and a subsequently-applied operating level having a voltage greater than the actuation voltage of the switch. The circuit may in an embodiment further include sensing circuitry operably coupled to the control circuitry and adapted to determine the actuation voltage of the switch. The circuit may further include voltage translation circuitry and/or electrostatic discharge protection circuitry in some embodiments, similar to that described above.

In addition to the methods and circuits described above, micro-electromechanical switch modules are contemplated herein. In an embodiment, a switch module includes a micro-electromechanical switch and first and second signal lines arranged proximate to the switch such that the lines are coupled together when the switch is closed. The module further includes sensing circuitry coupled to the first and second signal lines and adapted to sense a performance parameter of the switch, and control circuitry coupled to at least one terminal of the switch and adapted to initiate corrective action when switch performance is below a predetermined level. In another embodiment, a switch module includes a micro-electromechanical switch having a control element and a contact surface, and signal generation circuitry adapted to apply a time-varying voltage to the control element at a time when the switch has been closed as part of a conditioning procedure for the contact surface. An additional embodiment of a switch module includes a micro-electromechanical switch having a control element, signal generation circuitry adapted for application of a voltage profile including at least two nonzero voltage levels to the control element, and control circuitry operably coupled to the signal generation circuitry and adapted to initiate the application of a voltage profile in order to actuate the switch.

In addition to the methods, circuits and modules described above, a computer-usable carrier medium is contemplated herein. The carrier medium may be a storage medium, such as a magnetic or optical disk, a magnetic tape, or a memory. In addition, the carrier medium may be a transmission medium, such as a wire, cable, or wireless medium along which data or program instructions are transmitted, or a signal carrying the data or program instructions along such a wire, cable or wireless medium. The carrier medium may contain program instructions executable for carrying out embodiments of the methods described herein. For example, a carrier medium may contain program instructions executable by a computational device for receiving a measured performance parameter value of a micro-electromechanical switch, comparing the received value to a stored predetermined parameter value, and, upon detecting switch performance below a level corresponding to the predetermined value, initiating corrective action.

BRIEF DESCRIPTION OF THE DRAWINGS

Other objects and advantages of the invention will become apparent upon reading the following detailed description and upon reference to the accompanying drawings in which.

Figure 1A:
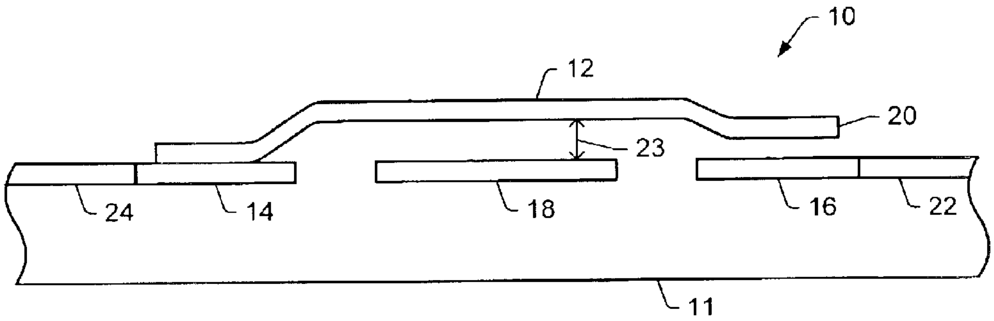
FIG. 1A is a cross-sectional view of a conductive-beam cantilever switch.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

A cross-sectional view of a MEMS cantilever switch 10 is shown in FIG. 1A. Conductive bean 12 is fixed at one end to contact pad 14. The other end of beam 12 resides a spaced distance above a second contact pad 16 when the switch is open, as in FIG. 1. Gate electrode, or control element, 18 underlies beam 12 between the two contact pads. In the electrostatic switch of FIG. 1, application of an electrostatic potential difference between gate electrode 18 and beam 12 creates an attractive electrostatic force between them, causing beam 12 to move downward. Contact element 20 at the end of beam 12 is thereby connected to contact pad 16, so that a signal may be passed between contact pads 14 and 16 along beam 12. The switch remains closed as long as the potential is applied. Upon removing the applied potential, the spring force of the cantilever beam 12 should pull the beam back up, opening the switch. It is noted that in FIGS. 1A, 1B and 1C, as well as in the other perspective and cross-sectional views provided herein, the vertical dimensions are exaggerated for illustrative purposes. Gap 23 between beam 12 and electrode 18, for example, may be on the order of a micron. The width of cantilever 12 may be on the order of tens to hundreds of microns, on the other hand, while the length of the cantilever may be on the order of tens to hundred of microns.

Figure 1B:
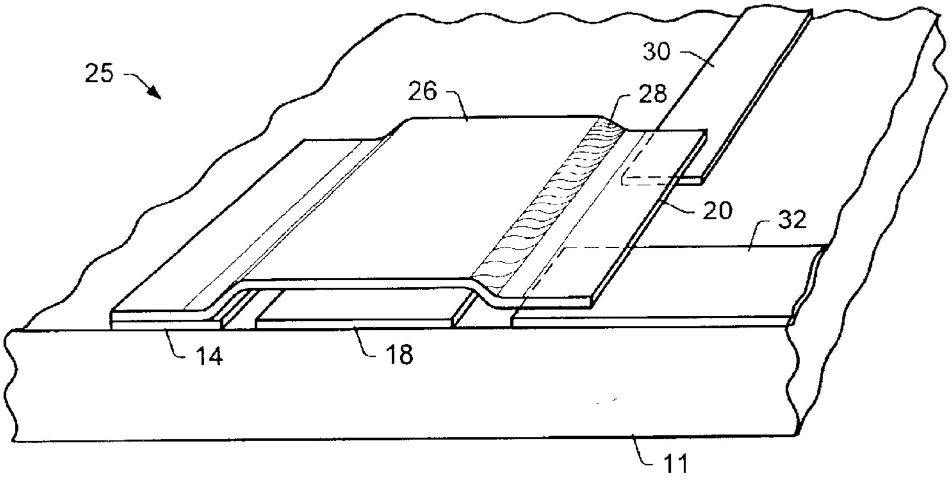
FIG. 1B is a perspective view of a cantilever switch having the beam's free end electrically insulated from its pinned end.

Switch 10 of FIG. 1A is formed upon substrate 11. At least the upper surface of substrate 11 is insulating, so that the substrate could include, for example, a high-resistivity semiconductor or an insulating layer formed upon a conducting or semi-conducting substrate. In the embodiment of FIG. 1A, signal lines 24 and 22 are connected to contact pads 14 and 16, respectively. Signal lines 22 and 24, conductive element 18, contact pads 14 and 16, and beam 12 could be formed from single conductive layers (one layer for beam 12, and an underlying layer for the other elements). Alternatively, one or more of the elements could be multilayer structures. At least a portion of each element must be conductive, however, such that a continuous conductive path is formed between signal line 24 and signal line 22 when switch 10 is closed. In an embodiment, switch 10 is formed from metal on a semiconductor substrate such as silicon, A perspective view of an alternative switch arrangement is shown in FIG. 1B. Instead of having a conductive beam which electrically couples contact pads on either end of the beam, switch 25 has a beam which insulates its free end from its pinned end. Conductive beam portion 26 includes a conductive area arranged over control element 18, so that applying a voltage to element 18 will provide an electrostatic force needed to close the switch. Insulating portion 28 isolates this conductive area from contact element 20, however. In this embodiment, closing the switch connects signal lines 30 and 32 together through conductive element 20, rather than through the length of the beam as in FIG. 1A. Although lines 30 and 32 are shown in a right-angle arrangement in FIG. 1B, they could of course be arranged in a straight line or any number of other orientations, as long as a portion of each line underlies contact element 20. Furthermore, the shape of insulating portion 28 may vary from that shown. For example, an insulating layer could extend along much of the beam, with conductive layers formed above or below the insulating layer to form conductive portion 26 and conductive element 20. In addition, insulating portion 28 could appear near the pinned end of the beam, rather than the free end, so that conductive element 20 could be in contact with conductive portion 26. This might make the completed signal line undesirably wide in the vicinity of the closed switch, however. In the embodiment of FIG. 1B, it is preferred that a conductive area is arranged over all of control element 18 and that conductive element 20 is isolated from any signal which may appear on the pinned end of the beam.

Figure 1C:
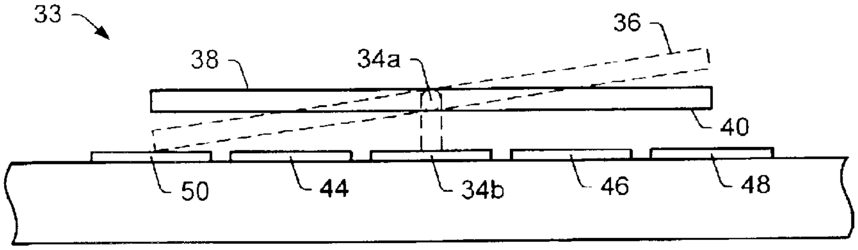
FIG. 1C is a cross-sectional view of a "teeter-totter" switch.

A cross-sectional view of an additional switch embodiment is shown in FIG. 1C. Switch 33 is a fulcrum, or "teeter-totter," switch. The beam of the switch is fixedly configured to rotate around a torsional support 34*a* near the center of the beam, at an anchor site 34*b*. Left-side beam portion 38 is moved using control element 44, while right-side beam portion 36 is moved using control element 46. When an actuation voltage is applied to control element 44, and not to control element 46, contact element 42 makes contact with underlying contact pad 50, while contact element 40 remains above its underlying contact pad 48. Reversing these control element voltages brings contact element 40 down and contact element 42 up, in a teeter-totter fashion. Switch 33 could be made with a conducting beam as in FIG. 1A, so that a signal line connected to torsional support 34*a* and/or anchor site 34*b* could be coupled to a line connected to either contact pad 50 or contact pad 48. Alternatively, contact element 40 and/or contact element 42 could be isolated from the pinned portion of the beam in the manner of FIG. 1B, and the isolated contact element could be used to connect two signal lines together.

The switches illustrated by FIGS. 1A–1C are merely exemplary of switches to which the circuits and methods described herein may be applied. Other switch designs may also be suitable. For example, a two-ended (also "membrane" or "strap") configuration of the cantilever switches shown in FIGS. 1A and 1B could also be used. In such a configuration, a contact element such as element 20 would be along the length of (often at the midway point) a beam pinned at both ends. One or more control gates could then be arranged on either side of the contact element, between the element and each end. As another example, aspects of the signal line configurations of FIGS. 1A and 1B could be combined in some embodiments. In this way, a signal at the pinned end of the beam could be connected to two or more signal lines underlying the free end of the beam, so that the same signal could be fed to multiple lines. The particular shapes and construction of the switches may also be varied from that shown in FIGS. 1A–1C. For example, contact pads at the pinned ends of the beams shown, such as pads 14 and 34, may be integral with the beam itself or may be omitted in some embodiments.

Figure 2A:
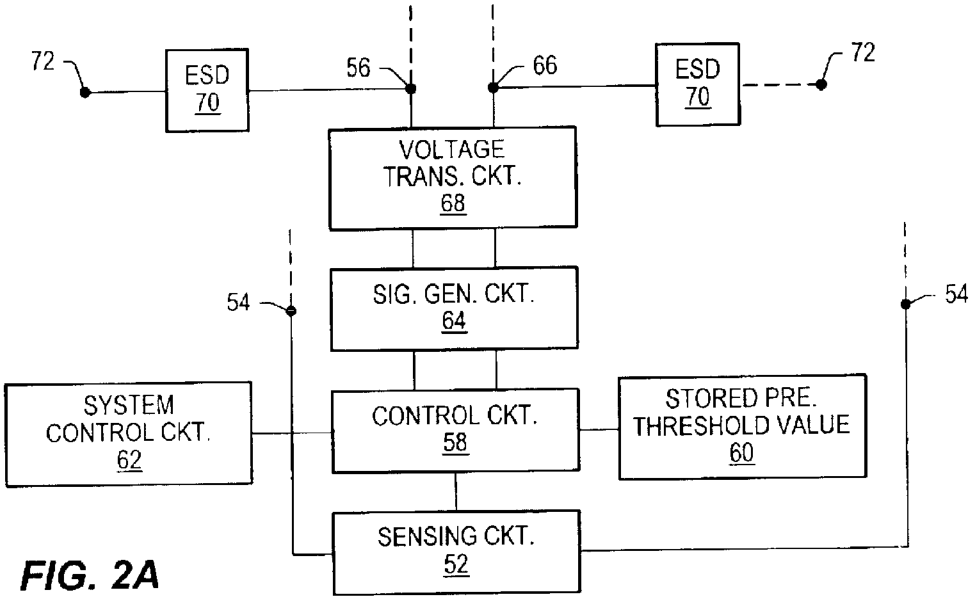
FIG. 2A is a block diagram of a circuit for maintaining performance of a micro-mechanical switch.

A block diagram illustrating an embodiment of a circuit for maintaining performance of a switch such as those of FIG. 1 is shown in FIG. 2A. In this embodiment, sensing circuitry 52 is coupled between a pair of signal line nodes 54. Nodes 54 are operably coupled to first and second signal lines, respectively, associated with the switch for which performance is to be maintained. "Operably coupled" as used herein means coupled at the time the circuit in question is in operation. This coupling during operation is indicated by the dashed lines extending from nodes 54, though the signal line nodes are not shown in FIG. 2A. The first and second signal lines may be lines such as those shown in FIGS. 1A–1C. The first and second signal lines are preferably lines which are coupled together when the switch is closed. Such lines could include, for example, lines 24 and 22 in FIG. 1A and lines 30 and 32 in FIG. 1B. Because sensing circuitry 52 is adapted to sense a performance parameter value of the switch, the circuit should be coupled to the signal lines in such a way that the value being sensed is not altered by the connection of the sensing circuit. In an embodiment, nodes 54 could be coupled to respective signal pads, with the pads separated from the respective first and second signal lines by high-valued resistors. Alternatively or in addition, sensing circuitry 52 could include high input resistances seen by nodes 54.

Sensing circuitry 52 is adapted to sense one or more performance parameters of the switch. In an embodiment, the performance parameter is the resistance between nodes 54. When the switch is closed, the resistance between the signal lines coupled to nodes 54 may be indicative of the quality of the electrical contact made by the switch. An increase in resistance, for example, may indicate degradation or contamination of a contact surface. In some embodiments, sensing circuitry 52 may be adapted to sense capacitance between nodes 54. When the switch is open, the capacitance between the signal lines coupled to nodes 54 may be indicative of the position of the switch, such as whether the switch is opening properly or returning to the correct initial position. Sensing circuitry 52 may also in some embodiments be coupled to control node 56, where control node 56 is operably coupled to a control element of the switch (as suggested by the dashed line extending from node 56).

In the embodiment of FIG. 2A, sensing circuitry 52 is coupled to control node 56 through control circuitry 58. In such an embodiment sensing circuitry 52 may be adapted to sense the control voltage applied to the switch as a function of time. Combining this voltage signal with information as to the resistance and/or capacitance across the switch may allow sensing of performance parameters such as the control element voltage required to close the switch or the time needed to close the switch. Control circuitry 58 is adapted to evaluate the performance parameter value sensed by sensing circuitry 52 and initiate corrective action if the switch performance is below a predetermined level.

In an embodiment, control circuitry 58 is adapted to compare the sensed performance parameter value with a stored threshold value 60 in order to evaluate the sensed performance parameter value. Stored threshold value 60 could include acceptable values of, for example, resistance, capacitance or time to open or close the switch, depending on the performance parameters being sensed. Threshold value 60 could be stored using various storage elements, such as memory cells or registers. Control circuitry 58 may in some embodiments be coupled to system control circuitry 62 where circuitry 62 controls a larger system containing the switch. This connection is shown by dashed lines in FIG. 2A. Corrective action initiated by control circuitry 58 may in some embodiments include applying a specific voltage sequence to control node 56, where the voltage sequence is generated using signal generation or conditioning circuitry 64, or changing the operating voltage. The corrective action may, alternatively or in addition, include activating an alternative switch using alternative control node 66, where node 66 is operably coupled to the control element of the alternative switch.

In some embodiments, the circuit for maintaining performance of a switch may include voltage translation circuitry 68. Voltage translation circuitry 68 may be used to translate from the voltage levels used in the sensing, control, and signal generation circuitry to the voltage levels used to actuate the switch. In an embodiment for which the sensing, control and signal generation circuitry are implemented using a silicon-based integrated circuit, for example, the logic levels employed by these circuits may be approximately 0V and approximately 3V. The voltages needed for actuation of a MEMS switch, on the other hand, may be on the order of tens of volts. Although it is believed to be advantageous to implement as much as possible of the circuit at low voltages, voltage translation circuitry 68 could in some embodiments be arranged farther from control nodes 56 and 66, such that some of the signal generation or control circuitry would be implemented at voltages compatible with switch actuation.

Alternatively or in addition, the circuit may include electrostatic discharge (ESD) protection circuitry 70. In the embodiment of FIG. 2A, circuitry 70 is coupled between control node 56 and an external terminal 72 which can access control node 56 and thereby the control element of the switch. The electrostatic discharge circuitry may help prevent unintended application of electrostatic charge to the gate of the switch. In an embodiment for which the switch has multiple gates, ESD protection may be provided for each of the gates. Similarly, in an embodiment such as that of FIG. 2A including an alternative control node corresponding to an alternative switch, ESD protection may be provided for the alternative switch, or alternatively or in addition to ESD protection on nodes 56/66, ESD protection can be applied to nodes 54, as well as or alternatively to one or more terminals shown.

In FIG. 2A and in all other block diagrams appearing herein, the blocks are intended to represent functionality rather than specific structure. Some implementation details, such as power supplies, are not shown explicitly in FIG. 2A. The "circuits" and "circuitry" described herein may be implemented in hardware and/or software as appropriate. Any or all of the sensing, control, signal generation/conditioning, or voltage translation circuitry could include a microprocessor, for example. Implementation of the represented circuit using circuitry and/or software could involve combination of multiple blocks into a single circuit, or combination of multiple circuits to realize the function of a block. Furthermore, the system and methods described herein may be implemented using various combinations of hardware and/or software, and at one or more of various different levels of hardware and/or software. Hardware aspects of the circuit of FIG. 2A could be implemented in various ways, from inclusion in a single integrated circuit, to a circuit having discrete component circuits, even a collection of bench-top equipment.

Figure 2B:
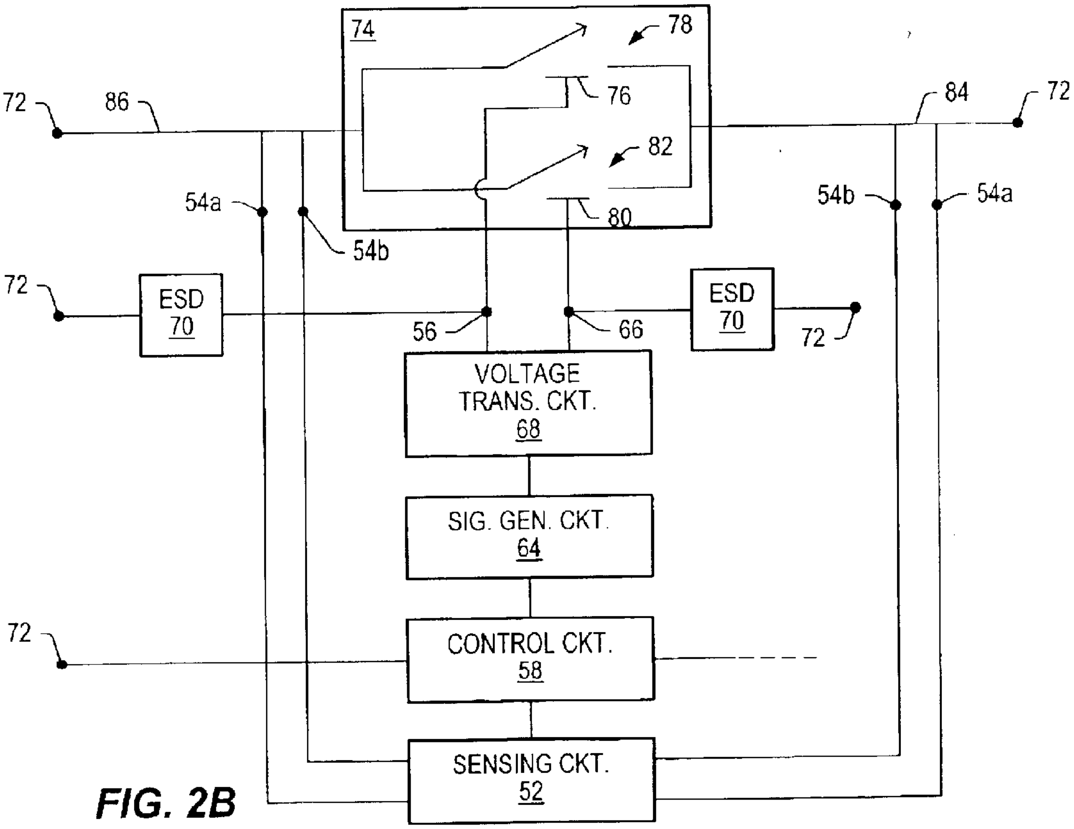
FIG. 2B is a block diagram of a switch module including the circuit of FIG. 2A.

In addition to the circuit described above, a micro-electromechanical switch module is contemplated herein, where the module is a combination of the switch and the circuit to maintain or control it. A block diagram of an exemplary embodiment of such a switch module is shown in FIG. 2B. A circuit such as that described with reference to FIG. 2A is shown connected to a pair of MEMS switches 74. For example, control node 56 is shown coupled to control element 76 of switch 78, while alternative control node 66 is coupled to control element 80 of alternative switch 82. Switches 78 and 82 are shown in a schematic form here, with a single control element. As noted above in the discussion of FIG. 1, a variety of MEMS switches may be formed. For switches with multiple control elements, the circuits of FIGS. 2A and 2B would include corresponding multiple control nodes. In the embodiment of FIG. 2B, sensing circuitry 52 is coupled to two sets of sensing nodes 54*a* and 54*b*. One of each set of signal nodes is connected to signal line 86, and the other to signal line 84. The two sets of sensing nodes may be useful in performing a resistance measurement, for example, in which a voltage could be applied using one set of nodes and the resulting current measured using the other set. Lines 84 and 86 are coupled to either end of switches 78 and 82 so that closing one of the switches connects the signal lines together. Whether switch 78 or switch 82 is used depends on which of control elements 80 and 76 is energized.

The switch arrangement of FIG. 2B is merely exemplary. For example, other configurations of the signal lines, such as that shown in FIG. 1B, could be used. The switch module of FIG. 2A includes some exemplary external terminals 72 which may be used, for example, to provide signals to the signal lines and/or the control gates associated with the switches. Other terminals not shown, such as power supply terminals, may also be included. In addition, not all of the terminals 72 shown in FIG. 2B may be needed in some embodiments. For example, the external terminals coupled to control node 56 and alternate control node 66 through ESD circuitry 70 may be used to apply signals to control elements 76 and 80 of switches 78 and 82, respectively. In other embodiments, however, application of external signals to these control elements could be done through control circuitry 58, so that any applied signals could be altered pursuant to methods described herein for maintaining switch performance.

Figure 3A:
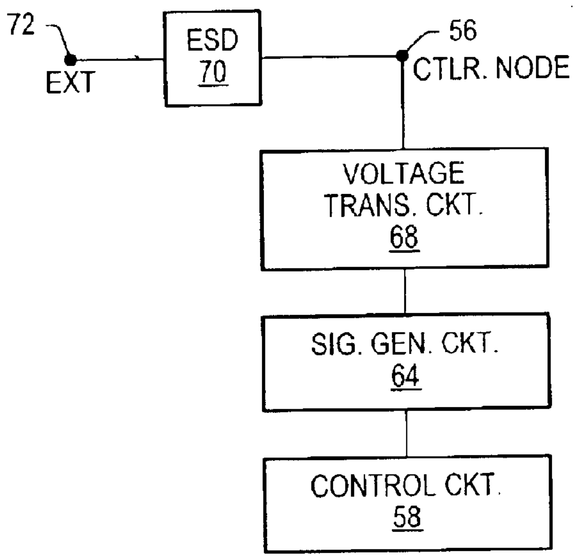
FIG. 3A is a block diagram of a circuit for actuating a micro-electromechanical switch or conditioning a contact surface of the switch.

A block diagram illustrating an embodiment of a circuit for actuating a micro-electromechanical switch or conditioning a contact surface of the switch is shown in FIG. 3A. The embodiment of FIG. 3A includes a control node 56 coupled to control circuitry 58 through signal generation or conditioning circuitry 64 and voltage translation circuitry 68. ESD circuitry 70 may be coupled between control node 56 and an external terminal 72. As in the case of these elements in FIGS. 2A and 2B, voltage translation circuitry 68 and ESD circuitry 70 may be omitted in other embodiments. In an embodiment for which the circuit of FIG. 3A is used for actuating of a micro-electromechanical switch, signal generation/conditioning circuitry 68 is adapted to provide a voltage profile including at least two nonzero voltage levels to control node 56.

In an embodiment for which the circuit is for conditioning a contact surface of the switch, signal generation/conditioning circuitry is adapted to provide a time-varying voltage to the control node at a time when the switch has been closed. Ways in which voltage profiles such as these may be provided include generation of a profile by circuitry 68 or modification by circuitry 68 of a profile provided by control circuitry 58 or provided externally. Examples of particular voltage profiles which may be provided are discussed below in the descriptions of FIGS. 4 and 5. Control circuitry 58 is adapted to initiate the application to the control node of the voltage profile provided by the signal generation circuitry. The control circuitry may in some embodiments be adapted to initiate application of a particular voltage profile in response to an evaluation of a performance parameter, as discussed above in the description of FIG. 2.

Alternatively, control circuitry 58 may be adapted to initiate application of the profile after some specified time or number of switch cycles has elapsed, especially in embodiments for which the circuit is for conditioning the switch contact. The control circuitry could also be adapted to initiate application of a voltage profile in response to a command from system control circuitry, such as circuitry 62 of FIG. 1A, or to some other external command.

Figure 3B:
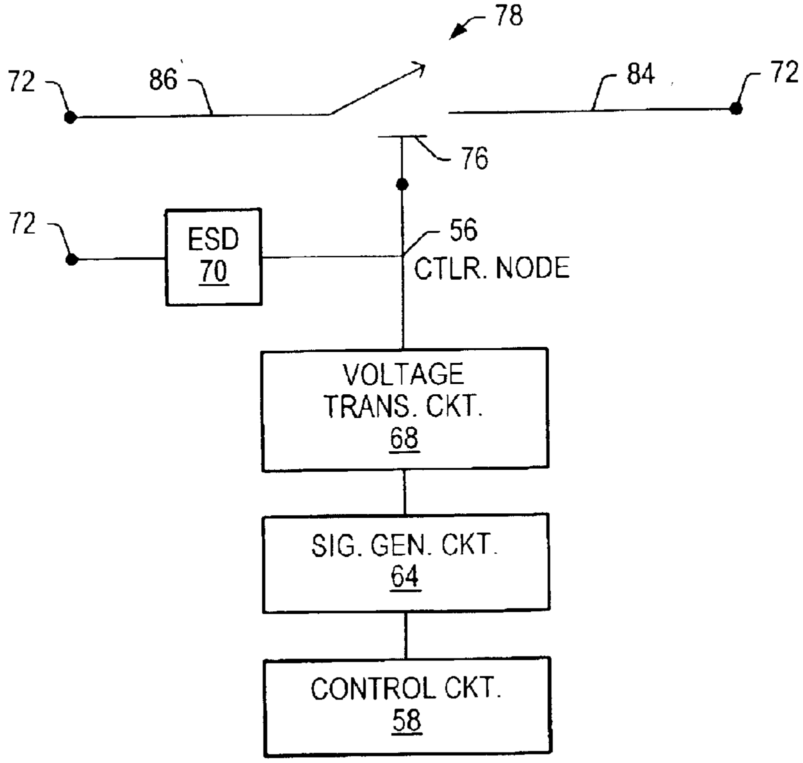
FIG. 3B is a block diagram of a switch module including the circuit of FIG. 3A.

A block diagram of a switch module incorporating the circuit of FIG. 3A is shown in FIG. 3B. In the embodiment of FIG. 3B, control node 56 is coupled to control element 76 of switch 78, where closing of switch 78 couples signal lines 86 and 84 together. As noted above in the description of FIG. 2B, many configurations of the switch, signal lines and external terminals in a module such as that of FIG. 3B are possible and contemplated. A module such as that of FIG. 2B or 3B may be suitable for use in a larger system in place of a switch alone. The module may act as a higher-performance switch, where the added performance in this case is provided by the associated circuitry rather than solely by the properties of the MEMS switch alone.

Figure 4A:
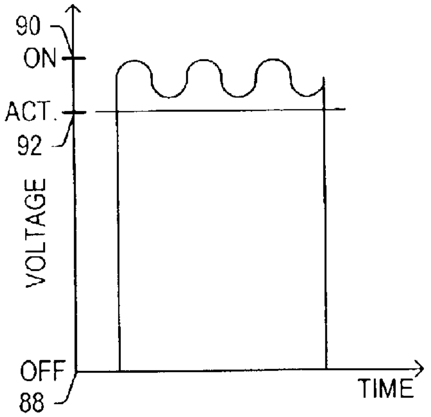
FIGS. 4A and 4B are graphs of exemplary embodiments of voltage waveforms which may be applied to clean a contact surface of a switch.
Figure 4B:
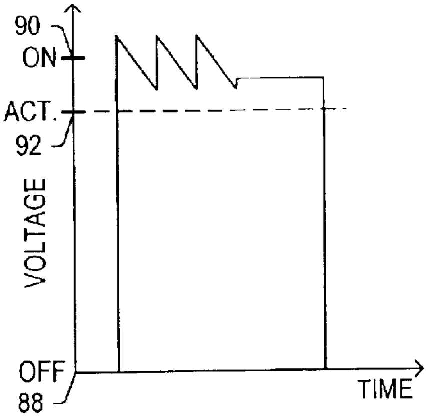
Figure 4C:
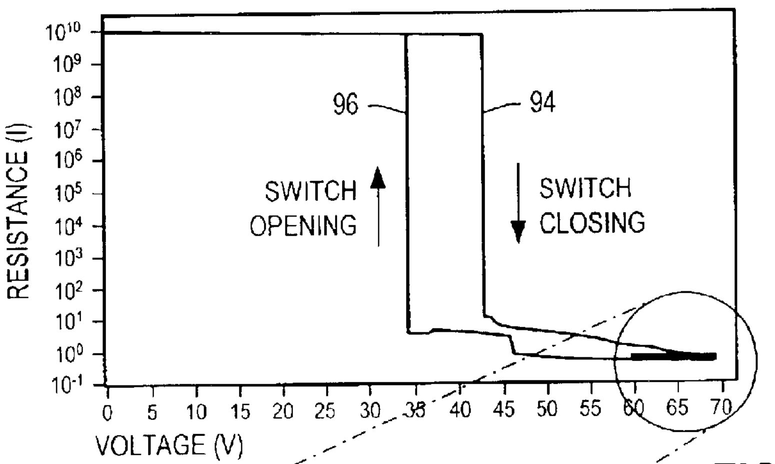
FIG. 4C is a graph of switch resistance versus applied voltage during an exemplary contact conditioning procedure.
Figure 4D:
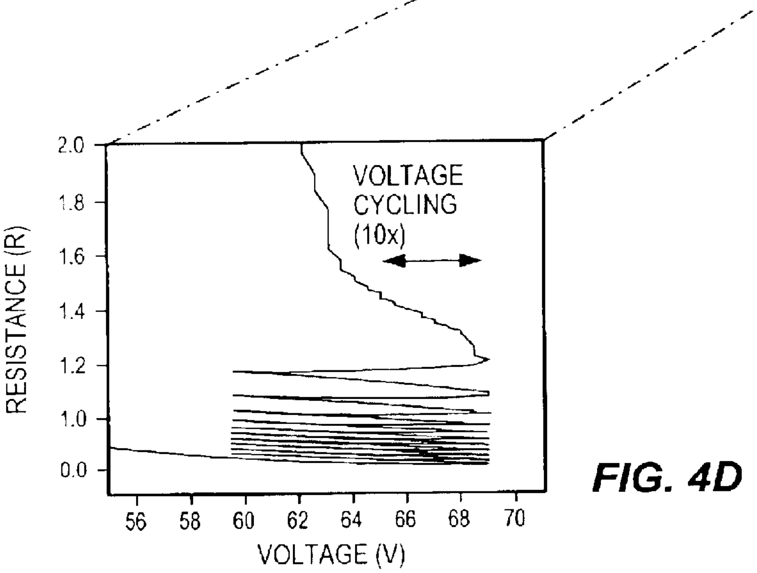
FIG. 4D is an enlarged view of the contact conditioning portion of the graph of FIG. 4C.

Graphs of exemplary voltage waveforms which may be applied to the control element of a switch to clean a contact surface of the switch are shown in FIGS. 4A and 4B. The graphs of FIGS. 4A and 4B are voltage vs. time plots of exemplary conditioning processes. Each plot shows the voltage applied to the control element varying from an "off" value 88 (here about zero volts) to a non-zero "on" value 90 which is greater than an "actuation" value 92 at which the switch closes. The time for which the voltage is at or above actuation value 92 (neglecting some transitory time) is the time during which the switch is closed. In some instances it may take the switch tens to hundreds of microseconds after voltage application to close. Because the beam of a MEMS switch generally moves horizontally to some extent as voltage beyond that needed to close the switch is applied, application of a time-varying voltage when the switch is closed can result in the scrubbing action of the contact surface of the beam against that of the underlying contact pad. This scrubbing action can improve the contact between the two surfaces, as illustrated by the resistance vs. voltage plots of FIGS. 4C and 4D. Trace 94 of FIG. 4C shows a rapid drop in resistance across the switch contact as the applied voltage goes through the actuation voltage (about 42 volts in this case), indicating closing of the switch. The resistance continues to drop gradually as the voltage is increased to an "on" value of about 65 volts. The magnified view of FIG. 4D shows that the resistance drops further as the voltage is repeatedly varied between about 69 volts and about 59.5 volts.

The voltage is preferably varied so that the applied voltage remains above the actuation voltage during the entirety of the conditioning cycle, as illustrated in FIGS. 4A–4D. In some embodiments, however, the scrubbing action may be effective even if the beam of the switch lifts away from the contact pad during a part of the voltage variation. In other words, a conditioning process in which the lowest parts of the sinusoid of FIG. 4A dropped below actuation voltage 92 might also be effective in some cases. The time varying voltage could be a sinusoid as in FIG. 4A, a triangular wave as in FIG. 4B, or some other time-varying shape, such as a square wave. The time-varying voltage does not need to be periodic or have equal-amplitude swings, though a periodic waveform may be convenient to produce. The time-varying voltage profile could be applied during the entire time the switch is on, as in FIG. 4A, or for only part of this time, as in FIG. 4B.

Figure 5A:
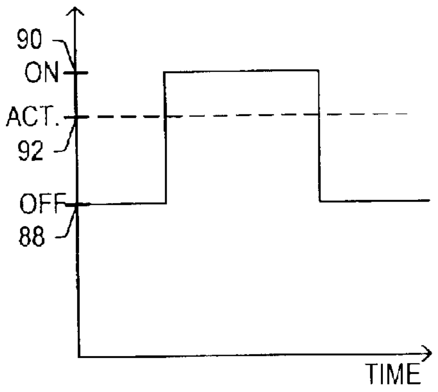
FIGS. 5A–5D are graphs of exemplary voltage waveforms which may be applied to actuate a switch.

Graphs of exemplary voltage profiles which may be applied to the control element of a switch to actuate the switch are shown in FIGS. 5A–5D. The profiles in FIGS. 5A–5D each contain at least two non-zero applied voltage values. In the profile of FIG. 5A, "off" voltage 88 is set not at zero volts, but at a non-zero value lower than actuation voltage 92. This non-zero "off" value may reduce the time needed to close the switch, or at least make the close time more reproducible. In some embodiments, measurement of the capacitance between the beam and the underlying contact pad or the control gate may be used to determine the position of the beam and control the position by adjusting the non-zero "off" value. In a variation on the profile of FIG. 5A, the non-zero off voltage could be applied before closing the switch (changing to the "on" voltage), but the applied voltage could be returned to zero in order to open the switch again. Going straight down to zero volts to open the switch may ensure that the switch opens fully and reduce the chances of sticking.

Figure 5B:
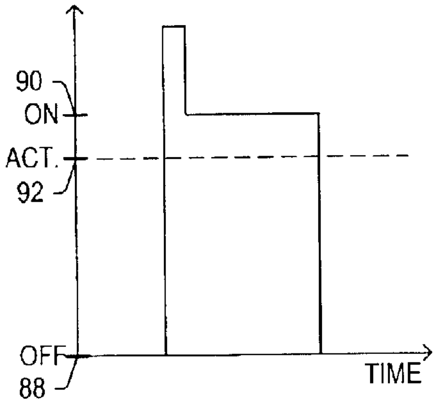

In the profile of FIG. 5B, the applied voltage is taken to a value above the eventual "on" value 90 for a time duration $t_0$. This "overshoot" during closing of the switch may improve the speed of closing the switch or overcome sticking of the already-closed side of a "teeter-totter" switch such as that shown in FIG. 1C. The time $t_0$ for which the voltage is kept at the elevated value is preferably kept shorter than the time needed for the beam of the switch to make contact with its underlying contact pad in response to the application of the voltage. In other words, the applied voltage is preferably lowered to the steady-state "on" value 90 before the closing switch actually makes contact. This may prevent the switch from closing with a force that will damage the contact or make it more likely to stick upon opening.

In some embodiments, the initial excess switching of FIG. 5B could be combined with a version of the non-zero off state of FIG. 5A. Generally speaking, the opening voltage is somewhere between the "off" voltage and the "actuation" voltage shown in FIGS. 5A–5D. Moreover, the degree by which voltage shown in FIG. 5B is decreased after duration $t_0$ can either be greater or less than the actuation voltage, even though FIG. 5B illustrates the amount to reside at a voltage level greater than the actuation voltage. All that matters is that the amount by which the voltage is "backed off" remains higher than the opening voltage (which may be less than the actuation voltage).

Figure 5C:
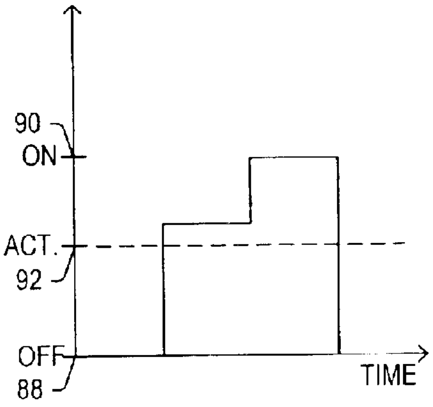
Figure 5D:
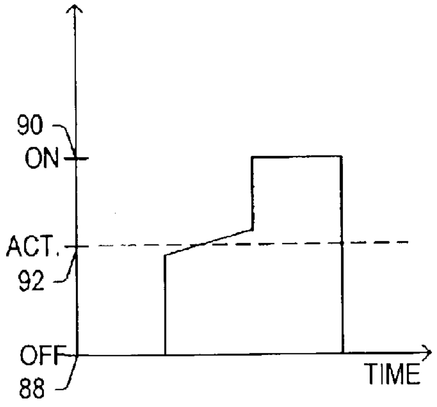

Another applied voltage profile which may help reduce sticking of a closed switch upon reopening is shown in FIG. 5C. In the profile of FIG. 5C, a switch is closed by initially applying a voltage only slightly higher than the actuation voltage, and then increasing the applied voltage to the steady-state "on" value 90. Such a profile may provide a "soft landing" for the switch beam upon the contact pad, reducing the likelihood of contact damage and/or subsequent sticking. This type of profile could in some embodiments be combined with a version of the non-zero off voltage of FIG. 5A. The profile of FIG. 5D is similar to that of 5C except that the closing of the switch is even more gradual since the voltage is slowly ramped through the actuation voltage. Ramp variations could also be substituted for any or all of the sharp voltage swings or the flat voltage states in any of the voltage profiles described above.

Figure 6:
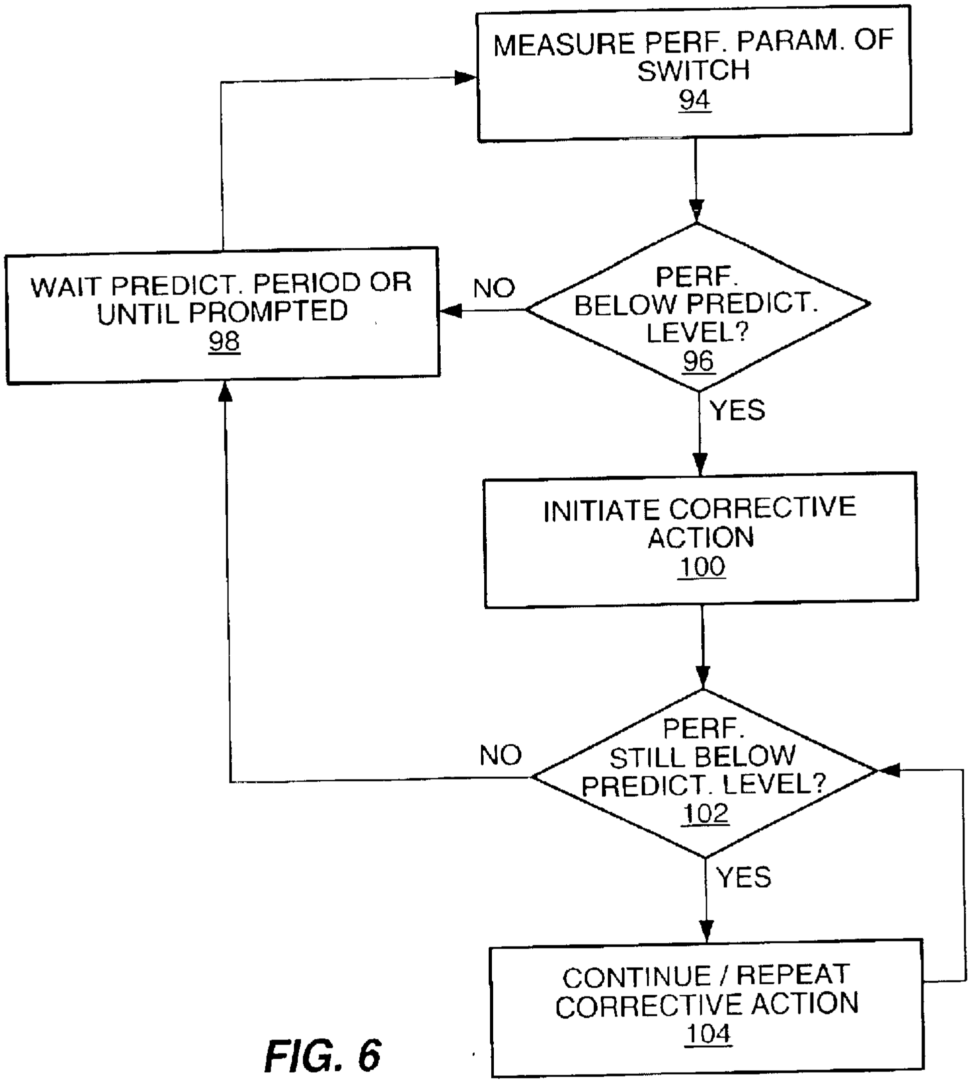
FIG. 6 is a flow diagram illustrating a method for maintaining performance of a micro-electromechanical switch.

A flow diagram illustrating an embodiment of a method for maintaining performance of a switch is shown in FIG. 6. The flow diagram begins with measurement of a performance parameter of the switch (box 94). This measurement could be performed by circuitry such as sensing circuitry 52 of FIG. 2A, possibly under the direction of circuitry such as control circuitry 58 of FIG. 2A. Alternatively, in an embodiment for which the method of FIG. 6 is carried out by a person, the measurement could be done by a person using diagnostic hardware and/or software. If the performance of the switch is below a predetermined level (decision box 96), an attempt at corrective action is initiated (box 100). If the performance does not require corrective action, a performance parameter of the switch is checked again after waiting some period, either a predetermined period or until prompted (box 98, box 94). The rechecking could be prompted by, say, a person's decision to check again, or an available time in the operation of an overall system containing the switch. The decision as to whether corrective action is needed could in an embodiment be made by a circuit such as the circuit of FIG. 2A, for example by a microprocessor associated with control circuitry 58 of FIG. 2A. Alternatively, the decision could be made by a person performing the method. If the decision is made by a circuit, it may involve comparing the measured performance parameter value to a predetermined threshold value for the performance parameter. The predetermined value may be settable and changeable by a user of the switch in some embodiments, and may be stored in a storage location associated with the circuit.

The initiation of corrective action (or at least attempted corrective action) may involve various activities, depending on the particular aspect of switch performance being corrected. If the contact resistance of the switch is too high, for example, a contact conditioning or forming or conditioning procedure may be initiated. Such a procedure may include application to the control element of the switch a time-varying voltage profile, such as those discussed in the description of FIG. 4 above, when the switch has been closed. As another example, if the capacitance of the switch when open is outside of a preferred range, the voltage applied to the switch when open may be adjusted. If the time needed for the switch to open or close is out of a preferred range, or the beam appears to be hitting the contact pad too hard, adjustments may be made to the voltage profile used to actuate the switch. Examples of the types of profile variations which may be use are given in FIG. 5 above. If the corrective action solves the problem (decision box 102), no further action is taken until it is again time to check a performance parameter value (box 98). If the attempted corrective action is ineffective, further corrective action may be taken (box 104) The additional corrective action may be simply a repeat of the previous action (as might be done in the case of a contact conditioning procedure), or may involve an alteration to the action taken previously (if a previous change to the voltage. profile used to actuate the switch was ineffective, for example).

Program instructions implementing methods such as those illustrated by FIG. 6 and described herein may be transmitted over or stored on a carrier medium. The carrier medium may be a transmission medium such as a wire, cable, or wireless transmission link, or a signal traveling along such a wire, cable or link. The carrier medium may also be a storage medium, such as a volatile or non-volatile memory (e.g., read-only memory or random access memory), a magnetic or optical disk, or a magnetic tape.

It will be appreciated to those skilled in the art having the benefit of this disclosure that this invention is believed to provide circuits and methods for maintaining performance of a MEMS switch, for actuating a MEMS switch, and for conditioning a contact surface of a MEMS switch. The stimuli used to perform the conditioning process can arise from either an electrical (voltage or current), magnetic or thermal sources. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A method of maintaining performance of a micro-electromechanical switch, said method comprising:

measuring a performance parameter of the switch; and upon detecting switch performance below a predetermined lever settable by the user of the switch, initiating corrective action by applying at least one of:

a time-varying voltage configured to induce a scrubbing action between contacts of the switch; and a modified control voltage profile for operating the switch, wherein the modified control voltage profile comprises at least of;

a different shaped profile; and an off voltage applied at a different magnitude.

2. The method of claim 1, wherein the performance parameter comprises a resistance of the switch when closed.

3. The method of claim 1, wherein the performance parameter comprises a capacitance of the switch when open, a control voltage needed to close the switch, or a time needed for opening or closing of the switch.

4. The method of claim 1, wherein the performance parameter comprises a cumulative number of open/close cycles performed by the switch.

5. The method of claim 1, wherein said measuring is repeated periodically.

6. A circuit for maintaining performance of a micro-electromechanical switch, said circuit comprising:

first and second signal line nodes, operably coupled to first and second signal lines, respectively, wherein the first and second signal lines are coupled together when the switch is closed;

sensing circuitry operably coupled to at least one terminal of the switch and adapted to sense a performance parameter value of the switch;

a control node coupled to the sensing circuitry and operably coupled to a control element of the switch; and control circuitry coupled to the control node and operably coupled to the at least one terminal of the switch, wherein the control circuitry is a adapted to evaluate the sensed performance parameter value and initiate corrective action upon detecting switch performance below a predetermined level, wherein, the corrective action comprises applying a varying control voltage to the control element to achieve a scrubbing action between contact elements of the switch.

7. The circuit of claim 6, wherein the performance parameter comprises a resistance or a capacitance between the any two terminals of the switch.

8. The circuit of claim 6, wherein the performance parameter comprises a control element voltage required to close the switch or a time required to open or close the switch.

9. The circuit of claim 6, wherein the control circuitry is adapted to compare the sensed performance parometer value with a stored thresphold parameter value.

10. The circuit of claim 6, wherein the corrective action comprises applying to the control element a modified control voltage sequence. scrubbing action.

11. The circuit of claim 6, further comprising voltage translation circuitry operably coupled between the control circuitry and the control element of the switch, wherein the voltage translation circuitry is adapted to convert voltages output by the control circuitry to relatively higher voltages needed to actuate the switch.

12. The circuit of claim 6, further comprising electrostatic discharge protection circuitry coupled between the control element of the switch and an externally-accessible terminal of the switch.

13. The circuit of claim 6, wherein the circuit forms at least a portion of an integrated circuit.

14. A circuit for maintaining performance of a micro-electromechanical switch, said ciruit comprising:

first and second signal line nodes, operably coupled to first and second signal lines, respectively, wherein the first and second signal lines are coupled together when the switch is closed;

sensing cirucitry operably coupled to at least one terminal of the switch and adapted to sense a performance parameter value of the switch;

a control node coupled to the sensing cirucitry and operably coupled to a control element of the switch; and control circuitry coupled to the control node and operably coupled to the at least one terminal of the switch, wherein the control circuitry is adapted to evaluate the sensed performance parameter value and initiate corrective action upon detecting switch performance below a predetermined level, wherein the corrective action comprises applying to the control element a modified control voltage sequence comprising at least one of:

a different shaped profile; and an off voltage applied at a different magnitude.

15. The circuit of claim 14, wherein the corrective action further comprises applying a varying control voltage to the control element to achieve a scrubbing action between contact elements of the switch.

16. The circuit of claim 15, wherein the performance parameter comprises a resistance of the switch when closed.

17. The circuit of claim 15, wherein the performance parameter comprises a capacitance of the switch when open.

18. The circuit of claim 15, wherein the performance parameter comprises a control voltage needed to close the switch, or a time needed for opening or closing of the switch.

19. The circuit of claim 15, wherein the performance parameter comprises a time needed for opening or closing the switch.

20. The circuit of claim 15, wherein the performance parameter comprises a cumulative number of open/close cycles performed by the switch.

* * * * *

UNITED STATES PATENT AND TRADEMARK OFFICE
CERTIFICATE OF CORRECTION

PATENT NO. : 7,106,066 B2
APPLICATION NO. : 10/229586
DATED : September 12, 2006
INVENTOR(S) : Ivanciw et al.

It is certified that error appears in the above-identified patent and that said Letters Patent is hereby corrected as shown below:

IN THE CLAIMS:

Col. 13, line 61: Please delete “lever” and substitute --level--.

Col. 14:
line 42: Please delete “parometer” and substitute --parameter--.
line 43: Please delete “thresphold” and substitute --threshold--.
line 44: Add --further -- after “corrective action”.
line 46: Delete “scrubbing action.”

Signed and Sealed this

Seventeenth Day of April, 2007

JON W. DUDAS
*Director of the United States Patent and Trademark Office*